United States Patent [19]

Shirasawa et al.

[11] Patent Number: 4,654,691
[45] Date of Patent: Mar. 31, 1987

[54] SEMICONDUCTOR DEVICE WITH FIELD PLATE

[75] Inventors: Toshikatsu Shirasawa, Hitachi; Yoshikazu Hosokawa, Hitachiota, both of Japan

[73] Assignee: Hitachi, Ltd., Tokyo, Japan

[21] Appl. No.: 816,979

[22] Filed: Jan. 7, 1986

Related U.S. Application Data

[63] Continuation of Ser. No. 525,888, Aug. 24, 1983, abandoned.

[30] Foreign Application Priority Data

Aug. 27, 1982 [JP] Japan .................. 57-147779

[51] Int. Cl.$^4$ .................. H01L 29/52; H01L 27/12; H01L 29/743
[52] U.S. Cl. .................. 357/53; 357/68; 357/38; 357/49
[58] Field of Search .................. 357/52, 53, 68, 13, 357/49, 38

[56] References Cited

U.S. PATENT DOCUMENTS 3,538,398 11/1970 Whiting .................. 357/20
4,412,242 10/1983 Herman et al. .................. 357/53

FOREIGN PATENT DOCUMENTS 54-122983 9/1979 Japan .
0108771 6/1983 Japan .................. 357/52
2084397 4/1982 United Kingdom .................. 357/52 E Primary Examiner—William D. Larkins
Assistant Examiner—Mark Prenty
Attorney, Agent, or Firm—Antonelli, Terry & Wands

[57] ABSTRACT

Field plates for relaxing electric fields are provided for an active element in a semiconductor integrated circuit. A field plate integral with an electrode making ohmic contact with an elongated strip shaped diffusion region and extending beyond a pn-junction formed between the diffusion region and an adjacent region to surround the pn-junction has a larger width at its opposite ends than a width at its linear portions. A high breakdown voltage can be obtained by thus configuring the field plate without changing the diffusion region in size.

7 Claims, 9 Drawing Figures

SEMICONDUCTOR DEVICE WITH FIELD PLATE

This application is a contination of application Ser. No. 525,888, filed Aug. 24, 1983, and now abandoned.

This invention relates to a semiconductor device adapted to be incorporated in a semiconductor integrated circuit and more particularly to a semiconductor device provided with a field plate for electric field relaxation, adapted to be incorporated in a monolithic, semiconductor integrated circuit.

Field plates are known as arrangements to increase breakdown voltage of an active element such as a diode, transistor or a thyristor (see Japanese Preliminary Patent Publication (Kokai) No. 54-122983).

Figs. 1a and 1b show a prior art thyristor provided with field plates. A dielectric isolation substrate 1 includes a polycrystalline silicon support region 2, a silicon oxide film 3 acting as a dielectric film, and a single crystal silicon island region 4 acting as an n-type semiconductor matrix. Practically, the substrate 1 has a great number of island regions embedded in the support region 2. An n-type layer 5 of high impurity concentration intervenes between the island region 4 and the oxide film 3. A p-type emitter layer 6 and a p-type base layer 7, both in the form of an elongated strip, are formed by impurity diffusion in one major surface of the island region 4. The two elongated layers are in parallel with each other. In the p-type base layer 7, an n-type emitter layer a is formed by impurity diffusion in a portion close to the p-type emitter layer 6. An undoped portion of the island region 4 stands for an n-type base layer 9, and a four-layer lateral thyristor is thus constituted by the p-type emitter layer 6, n-type base layer 9, p-type base layer 7 and n-type emitter layer 8. Formed on the island region 4 is an oxide film 10 acting as a surface passivation film.

The oxide film 10 is not depicted in FIG. 1a. Electrodes 11 to 13 for the anode, gate and cathode make ohmic contact to the p-type emitter layer 6, p-type base layer 7 and n-type emitter layer 8, respectively, through windows formed in the oxide film 10. The respective electrodes 11 to 13 have portions acting as field plates 11a to 13a at areas dotted in FIG. 1a. The field plate 11a extends beyond a pn-junction $J_1$ formed between the p-type emitter layer 6 and the n-type base layer 9 to overlie the n-type base layer 9 through the oxide film 10. Similarly, the field plates 12a and 13a extend beyond a pn-junction $J_2$ formed between the n-type base layer 9 and the p-type base layer 7 to overlie the n-type base layer 9 through the oxide film 10. The field plate 11a surrounds the pn-junction $J_1$, and the field plate 12a cooperates with the field plate 13a to substantially surround the pn-junction $J_2$. The field plate 12a opposes the field plate 13a through a spacing which is large enough to prevent discharge across the spacing by a voltage applied between the two field plates. Formed on the oxide film 10 are wiring conductors 11b to 13b which extend from the electrodes 11 to 13 so as to be connected to predetermined portions of an adjacent island region not shown. The electrodes 11 to 13 integral with the field plates 11a to 13a and the wiring conductors 11b to 13b are formed simultaneously through vapor deposition process.

When a voltage for backward biasing the pn-junction $J_1$ is applied, a depletion layer is created in the n-type base layer 9 and extended by the field plate 11a. Similarly, when a voltage for backward biasing the pn-junction $J_2$ is applied, a depletion layer created in the n-type base layer 9 is extended by the field plates 12a and 13a. In proportion to the extension of the depletion layer, concentration of electric field within the depletion layer can be suppressed, evidencing effects which the field plate attains.

The field concentration is liable to occur at ends or edges or corners of the pn-junctions $J_1$ and $J_2$. The more the ends of the field plates 11a to 13a are rounded and the more the radii of curvature $R_1$, $R_2$ and $R_3$ of the field plates 11a to 13a are enlarged, the more the depletion layers are extended. Ends of the pn-junctions $J_1$ and $J_2$ are also rounded with corner radii $r_1$ and $r_2$ for improving the breakdown voltage.

Conventionally, the corner radii $r_1$ and $r_2$ of the pn-junctions $J_1$ and $J_2$ are centered at the same position as the corner radii $R_1$ to $R_3$ of the field plates 11a to 13a, as shown in FIG. 1a.

Linear portions of the field plates 11a to 13a are designed to have a configuration which is in conformity with that of the ends of corner radii $R_1$ to $R_3$. More particularly, letting widths of the linear portions of the field plates be $W_1$, $W_2$ and $W_3$, the corner radii $R_1$, $R_2$ and $R_3$ are $r_1+W_1$, $r_2+W_2$ and $r_2+W_3$, respectively. This means that the field plate 11a has a single extension width regardless of its position, i.e. at its linear portion and at its end to surround the pn-junction $J_1$. This also holds true for the field plates 12a and 13a which surround the pn-junction $J_2$.

If the widths $W_1$ and $W_3$ at the linear portions are increased to raise the breakdown voltage, a spacing $G_1$ between the opposing field plates 11a and 13a will be reduced and a discharge may be allowed to occur. Then, if a spacing $G_2$ between the opposing p-type emitter layer 6 and p-type base layer 7 is increased to allow the corner radii $R_1$ and $R_3$ to be increased, an increased voltage drop across the n-type base layer 9 in the conducting state will result, thus giving rise to an increased turn-on voltage.

Accordingly, in order to increase the radii $R_1$ and $R_3$ without impairing compatibility with the restrictions on the spacings $G_1$ and $G_2$, there is no other way than to increase the radii $r_1$ and $r_2$. However, when considering increase of the radii $r_1$, for instance, an increased radius $r_1$ leads to an increased width of the p-type emitter layer 6 with the result that the thyristor element is increased in size and the integration density will be degraded. When increasing the radius $r_2$, on the other hand, the width of the p-type base layer 7 is already sufficiently large and needs not be further increased, but the length of the n-type emitter layer 8 within the p-type base layer 7 must be reduced. In such a case, the length of the n-type emitter layer 8 facing to the p-type emitter layer 6 will be decreased, leading to an increase in the turn-on voltage. For these reasons, it has been impossible to raise the breakdown voltage by increasing the radii $R_1$ and $R_3$.

Incidentally, in accompaniment with the recent trend of decreasing the diffusion depth of the p-type emitter layer 6 and p-type base layer 7, the corner radii of the pn-junctions $J_1$ and $J_2$ in the depth dimension tend to be decreased. Difficulty of increasing the corner radius in the depth dimension as well as in the planar dimension makes it difficult to increase the breakdown voltage, even with the provision of the field plates 11a to 13a.

Similar problems are raised in a transistor element in which elongated strip shaped collector and emitter layers oppose to each other. In the transistor element, an increased spacing between the collector and emitter layers leads to a decrease in the current amplification factor $h_{FE}$.

An object of this invention is therefore to provide a semiconductor device adapted to be incorporated in an integrated circuit, and capable of improving the breakdown voltage by providing a field plate.

Another object of this invention is to provide a semiconductor device adapted to be incorporated in an integrated circuit, in which the device is provided with field plates and can improve the breakdown voltage without degrading various characteristics of the device.

Still another object of this invention is to provide a semiconductor device adapted to be incorporated in a semiconductor integrated circuit, in which the device is provided with a field plate and can improve the breakdown voltage without increasing the size of the device.

According to an aspect of this invention, an elongated, doped semiconductor region in a lateral semiconductor element is surrounded by a field plate which has a larger width at its end than that at its linear portion.

With this construction, a depletion layer at the end can be extended to release concentration of electric field. Together with the fact that a high breakdown voltage can be maintained in the linear portion of the field plate, a high breakdown voltage can be obtained without increasing a spacing between the opposing doped regions and without decreasing a spacing between opposing field plates.

Further details of the present invention will become apparent from the following detailed description taken in conjunction with the accompanying drawings, in which:

FIG. 1b is a sectional view taken on line Ib—Ib in FIG. 1a;

FIG. 2b is a sectional view taken on line IIb—IIb in FIG. 2a;

FIG. 3b is a sectional view taken on line IIIb—IIIb in FIG. 3a;

FIG. 4b is a sectional view taken on line IVb—IVb in FIG. 4a; and

Figure 1A:
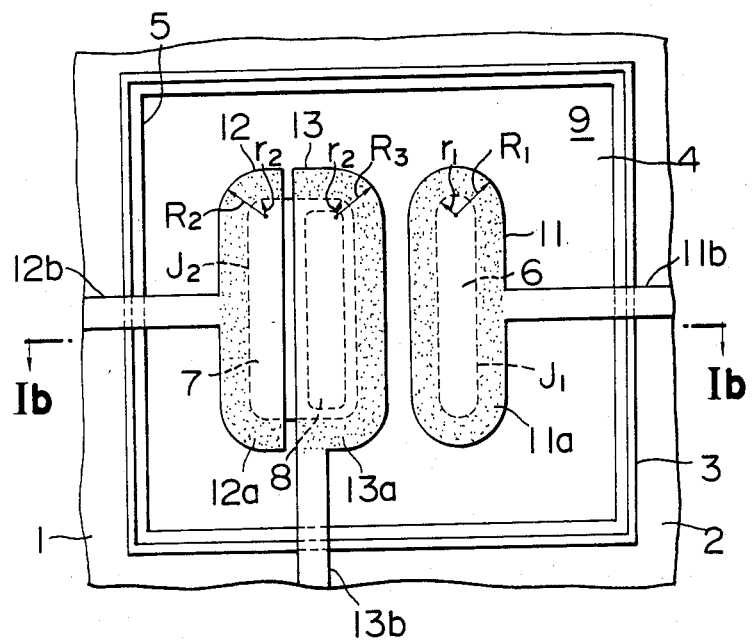
FIG. 1a is a plan view of a prior art semiconductor integrated circuit comprised of a thyristor provided with field plates.
Figure 1B:
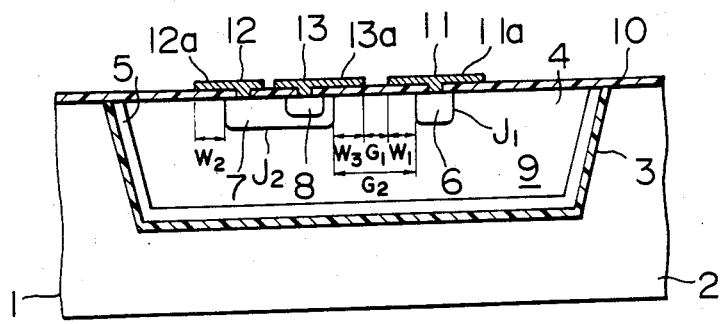
Figure 2A:
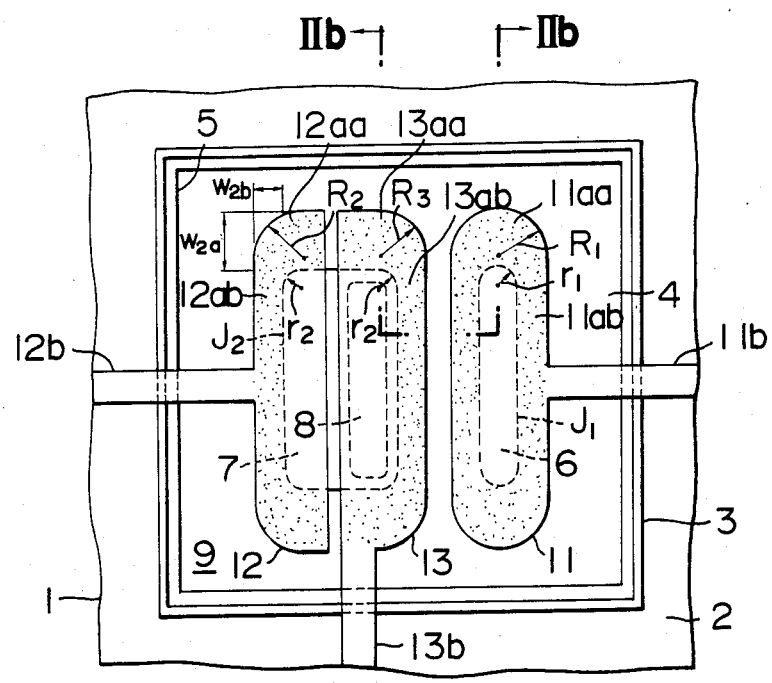
FIG. 2a is a plan view showing a semiconductor integrated circuit comprising a thyristor according to an embodiment of the invention.
Figure 2B:
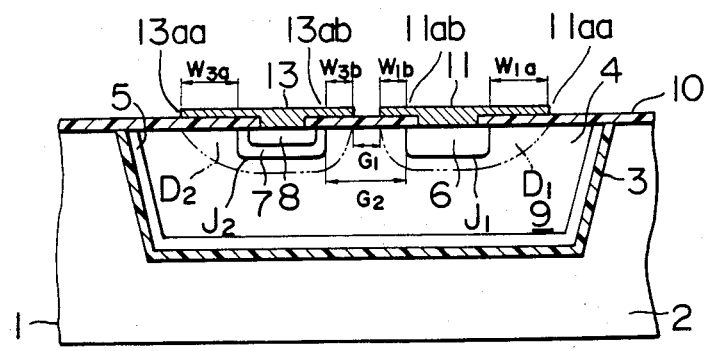
Figure 3A:
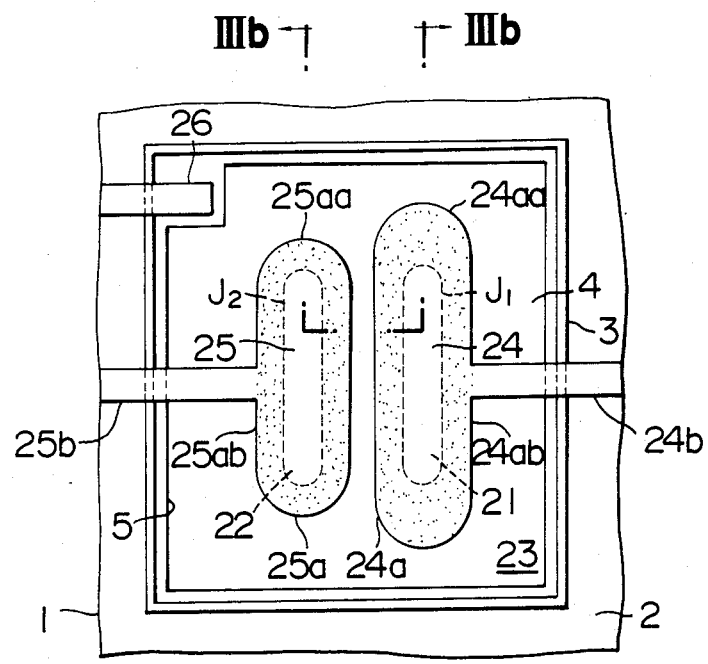
FIG. 3a is a plan view showing a semiconductor integrated circuit comprising a transistor according to another embodiment of the invention.
Figure 3B:
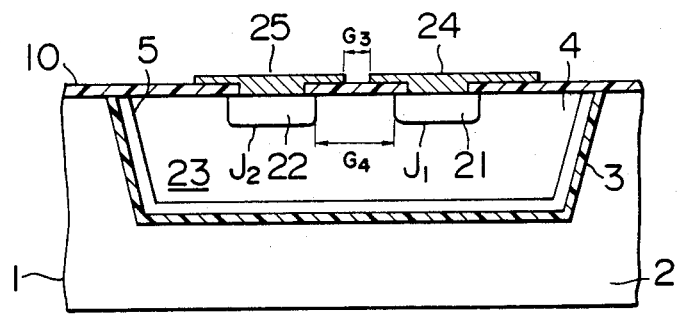
Figure 4A:
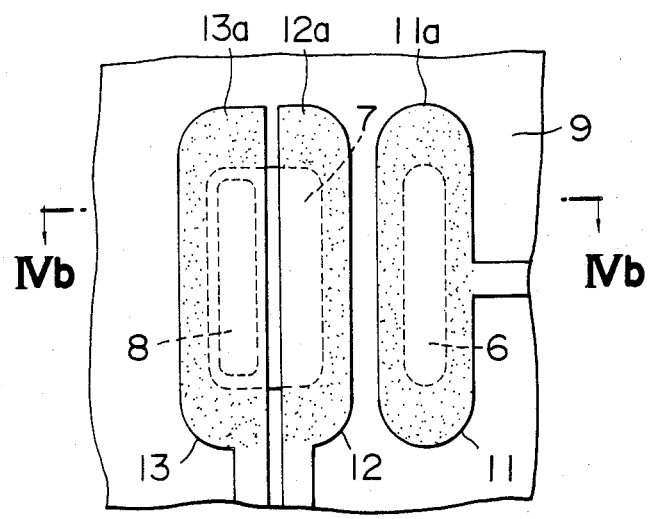
FIG. 4a is a plan view showing a semiconductor integrated circuit according to another embodiment of the invention wherein one island region of the semiconductor integrated circuit constitutes a lateral gate turn-off thyristor.
Figure 4B:
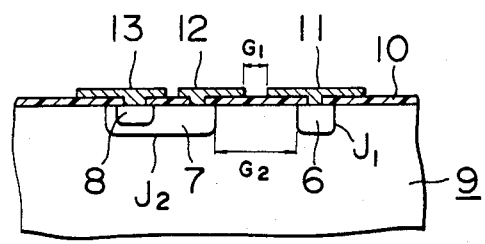

A semiconductor integrated circuit comprising a lateral thyristor according to an embodiment of the present invention is illustrated in FIGS. 2a and 2b in which like elements as those in FIGS. 1a and 1b are designated by like reference numerals. To avoid prolixity of description, like elements will not be described hereinbelow.

As shown in FIGS. 2a and 2b, a p-type emitter layer 6 and a p-type base layer 7 are both in the form of an elongated strip and rounded at their ends with corner radii $r_1$ and $r_2$. Electrodes 11 to 13 for anode, gate and cathode have portions acting as field plates 11a, 12a and 13a, and these field plates are also rounded at their corners with radii $R_1$, $R_2$ and $R_3$. The corner radii $r_1$ to $r_3$ are not centered at the same position as the center of the corner radii $R_1$ to $R_3$ but centers of the former radii are displaced from those of the latter radii. More particularly, centers of the corner radii $R_1$ to $R_3$ are displaced from those of the corner radii $r_1$ and $r_2$ toward the outside in a direction parallel to parallel opposing sides of the p-type emitter layer 6 and of the p-type base layer 7. As a result, the field plates 11a, 12a and 13a respectively have, at their ends 11aa, 12aa and 13aa, widths $W_{1a}$, $W_{2a}$ and $W_{3a}$ which are respectively larger than widths $W_{1b}$, $W_{2b}$ and $W_{3b}$ at their linear portions 11ab, 12ab and 13ab.

Edges of the depletion layers $D_1$ and $D_2$ created around the pn-junctions $J_1$ and $J_2$ under the respective reverse bias states in an n-type base layer 9 are superposedly shown at chained lines in FIG. 2b. It will be apparent that one of the junctions $J_1$ and $J_2$ is reverse-biased at one time. The depletion layer may be considered as a dielectric medium and an electric field is established therein. Electric fields immediately beneath the linear portions 11ab and 13ab exhibit parallel equipotential surfaces and a high breakdown voltage can be maintained. As will be clear from FIG. 2b, the depletion layers $D_1$ and $D_2$ below the field plate ends 11aa and 13aa is expanded longer than those below the field plate linear portions 11ab and 13ab. Therefore, in the depletion layers immediately beneath the ends 11aa and 13aa, field concentration can not take place and a high breakdown voltage can be maintained.

In FIG. 2b, a depletion layer immediately beneath the field plate 12a is not depicted. It should however be understood that since potentials at the gate electrode 12 and the cathode electrode 13 are substantially similar in comparison with the potential at the anode electrode 11, the depletion layer immediately beneath the field plate 12a generally has a configuration similar to that of the depletion layer $D_2$ immediately beneath the field plate 13. Accordingly, a depletion layer immediately beneath the end 12aa of the field plate 12a is also expanded and a high breakdown voltage can be maintained.

Accordingly, the widths $W_{1a}$, $W_{2a}$ and $W_{3a}$ of the field plate ends 11aa, 12aa and 13aa are simply required to be larger than the widths $W_{1b}$, $W_{2b}$ and $W_{3b}$ of the field plate linear portions 11ab, 12ab and 13ab whereas there is no need of decreasing the spacing $G_1$ between the linear portions, increasing the spacing $G_2$ between the p-type emitter layer 6 and the p-type base layer 7, or decreasing the length of an n-type emitter layer 8. Accordingly, it is possible to improve the breakdown voltage without impairing characteristics of the thyristor by simply changing the configuration of the field plate. Further, thanks to there being no necessity of increasing the width of the p-type emitter layer 6, the packing density is not degreaded.

For comparison of breakdown voltage at the pn-junction $J_1$, a sample of a prior art example shown in FIGS. 1a and 1b and a sample of a thyristor shown in FIGS. 2a and 2b having the same structure as the former sample, with the only exception that the planar pattern configuration of the field plate was changed, were prepared.

In the two samples, the corner radius $r_1$ of the p-type emitter layer 6 was 15 $\mu$m, the width $W_{1b}$ of linear portion 11ab of the field plate 11a was 20 $\mu$m, and the corner radius $R_1$ of end $11aa$ of the field plate $11a$ was 35 μm. In the prior art sample, the corner radius of the end of the p-type emitter layer 6 and the corner radius of the end of the field plate $11a$ were centered at the same position but in the sample according to the invention, the displacement between the end corner radius center of the p-type emitter layer 6 and the end corner radius center of the field plate $11a$, that is, the distance between two centers, was 20 μm.

With the prior art sample, the breakdown voltage was about 350 V, whereas with the sample of the present invention, the breakdown voltage was raised by 20 to 50 V. The raised amount of the breakdown voltage remained substantially unchanged when the displacement between the end corner radius center of the p-type emitter layer 6 and the end corner radius center of the field plate $11a$ was changed within a range of 20 to 50 μm. In addition, it was confirmed that the breakdown voltage could be improved or raised by modifying the configuration of the field plate end from the semicircular form into any convexly curved form such as an elliptical form or a hyperbolic form.

Although in the embodiment of FIG. $2a$ the relation of $R_1=R_2=R_3$ in the corner radii, the relation of $W_{1a}=W_{2a}=W_{3a}$ in the end widths and the relation of $W_{1b}=W_{2b}=W_{3b}$ in the linear portion widths are held for all the field plates $11a$ to $13a$, only a field plate above a pn-junction for which a high breakdown voltage is required may have a larger width at its end than that at its linear portion. Further, the opposing field plates may have different end widths and different linear portion widths.

FIGS. $3a$ and $3b$ show a semiconductor integrated circuit comprising a lateral three-layer transistor. In FIGS. $3a$ and $3b$, like elements to those in FIGS. $2a$ and $2b$ are designated by like reference numerals. A p-type collector layer 21 and a p-type emitter layer 22, both in the form of an elongated strip, are formed by impurity diffusion in one major surface of an island region 4 which is an n-type semiconductor matrix. These layers are in parallel with each other. Ends of the two layers 21 and 22 are rounded. An undoped region 23 and an n-type high impurity concentration layer 5 through which the island region 4 adjoins an oxide film 3 constitute a base layer. A collector electrode 24 and an emitter electrode 25 make ohmic contact with the p-type collector region 21 and the p-type emitter region 22, respectively, through windows formed in a silicon oxide film 10 serving as a surface passivation film on the island region. The collector electrode 24 and the emitter electrode 25 have portions acting as field plates $24a$ and $25a$ which surround pn-junctions $J_1$ and $J_2$. Wiring conductors $24b$ and $25b$ are integral with the field plates $24a$ and $25a$ corresponding to dotted areas in FIG. $3a$. A base electrode 26 makes ohmic contact to the high impurity concentration layer 5. Since in the transistor, a high breakdown voltage is required for the collector junction $J_1$, opposite ends $24aa$ of the field plate $24a$ contiguous to opposite ends of the p-type collector layer 21 are designed to have a width which is larger than that of linear portions $24ab$. Since the emitter junction $J_2$ does not require so high a breakdown voltage as the collector junction $J_1$, the field plate $25a$ has the same width at its ends $25aa$ and at its linear portions $25ab$.

With the above construction, there is no need of decreasing a spacing $G_3$ between opposing linear portions of the field plates $24a$ and $25a$, without being attended by occurrence of any discharge. In addition, a spacing $G_4$ between the collector layer 21 and the emitter layer 22 needs not be increased so that current amplification factor $h_{FE}$ of the transistor will not be reduced. Also, the collector layer 21 needs not be increased in area, thereby preventing decrease in the integration density.

In recent years, the trend of reducing the width and diffusion depth or thickness of the elongated strip shaped diffusion regions, that is, the p-type collector layer and p-type emitter layer for which the field plates are provided, is predominant, and concentration of electric field in the depletion layers tends to become intensive. However, according to the above structure, the field plate having a larger width at its ends than at its linear portions can reduce the concentration of electric field at the ends of the doped region, thereby attaining compatibility with the reduction in width and thickness of those diffusion regions.

In this embodiment, the p-type doped regions are formed in the n-type semiconductor matrix for illustration purpose only but obviously, the present invention may be applicable to a semiconductor devices wherein n-type doped regions are formed in a p-type semiconductor matrix. The isolated island substrate as described in terms of a dielectric isolation type may be of a pn-junction isolation type or an air separation type. Further, in preparing a gate turn-off thyristor, an n-type emitter layer may be disposed remote from a p-type emitter layer and a gate electrode may be interposed between an anode electrode and a cathode electrode. In addition, it is not always necessary that the corner radius at the end of the field plate be a sum of the linear portion width and the corner radius of the diffusion region to which the electrode integral with the field plate makes low resistance contact.

FIGS. $4a$ and $4b$ show a lateral gate turn-off thyristor formed in one island region of a semiconductor integrated circuit, wherein like elements as those in FIGS. $2a$ and $2b$ are designated by like reference numerals. Being different from the embodiment of FIGS. $2a$ and $2b$, an n-type emitter layer 8 formed in a p-type base layer 7 is remote from a p-type emitter layer 6, and a gate electrode 12 in ohmic contact with the p-type base layer 7 is interposed between an anode electrode 11 in ohmic contact with the p-type emitter layer 6 and a cathode electrode 13 in ohmic contact with the n-type emitter layer 8. The gate electrode 12 has a portion serving as a field plate $12a$ and the cathode electrode 13 has a portion serving as a field plate $13a$. The field plates $12a$ and $13a$ surround the substantial entirety of a pn-junction $J_2$.

Turning-off of the thyristor is achieved by drawing holes flowing from the p-type emitter layer 6 to the n-type emitter layer 8 (in the on-state) out of the gate electrode 12. According to this structure, holes can readily be drawn out since the gate electrode 12 is disposed close to and opposing to the anode electrode 11.

Like the embodiment of FIGS. $2a$ and $2b$, the breakdown voltage of the thyristor can be improved without changing a spacing $G_1$ between the field plates $11a$ and $13a$ and a spacing $G_2$ between the p-type emitter layer 6 and the p-type base layer 7.

Figure 5:
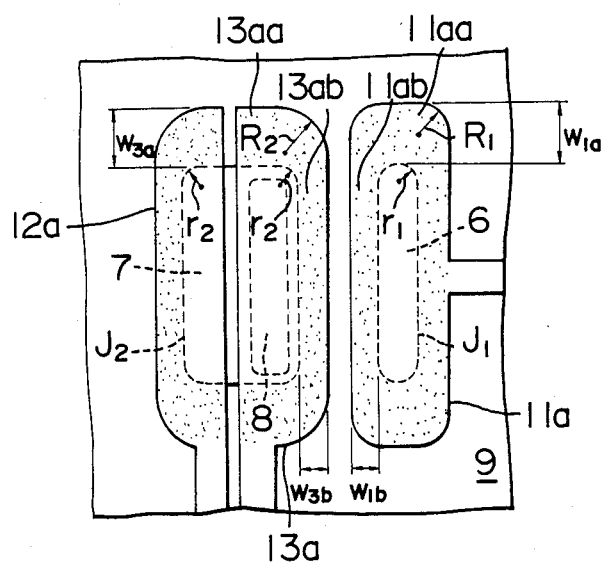
FIG. 5 is a plan view showing a semiconductor integrated circuit according to another embodiment of the invention, wherein one island region of the semiconductor integrated circuit constitutes a lateral thyristor.

FIG. 5 shows a thyristor modified from the thyristor shown in FIGS. $2a$ and $2b$. In FIG. 5, like elements as those in FIGS. $2a$ and $2b$ are designated by like reference numerals. This modification is different from the embodiment of FIGS. $2a$ and $2b$ in that corner radii at ends of field plates are dimensioned differently. A corner radius $R_1$ at an end $11aa$ of a field plate $11a$ integral with an anode electrode 11 in ohmic contact with a p-type emitter layer 6 is smaller than a sum of a corner radius $r_1$ of the p-type emitter layer 6 and a width $W_{1b}$ of a linear portion $11ab$ of the field plate $11a$. A corner radius $R_2$ at an end $13aa$ of a field plate $13a$ integral with a cathode electrode 13 in ohmic contact with an n-type emitter layer 8 is larger than a sum of a corner radius $r_2$ and a width $W_{3b}$ of a linear portion $13ab$ of the field plate $13a$. Namely, $R_1 < r_1 + W_{1b}$ and $R_2 > r_2 + W_{3b}$ stand.

This construction is based on the fact that a high breakdown voltage can be obtained if the linear portion $11ab$ of the field plate $11a$ opposes the linear portion $13ab$ of the field plate $13a$ with a spacing $G_1$ therebetween, and the end width $W_{1a}$ and the linear portion width $W_{1b}$ of the field plate $11a$ establish a relation $W_{1a} > W_{1b}$, and/or the end width $W_{3a}$ and the linear portion width $W_{3b}$ of the field plate $13a$ establish a relation $W_{3a} > W_{3b}$. The construction as shown in FIG. 5 is effective when a pn-junction $J_2$ is required to have a particularly high breakdown voltage which is higher than a breakdown voltage required for a pn-junction $J_1$.

The corner radius $R_1$ may be up to $r_1 + W_{1b}$. For the corner radius $R_2$, the condition of $r_2 + W_{3b} < R_2$ or $r_2 + W_{3b} > R_2$ can be selected dependent on required characteristics. This is because the width of the p-type emitter layer 6 is too narrow to have tolerance whereas the p-type base layer 7 includes the n-type emitter layer 8 and has a width larger than that of the p-type emitter layer 6, thus having tolerance.

Similar selection can be applied to the corner radii in the embodiments of FIGS. $3a$ and $3b$ as well as FIGS. $4a$ and $4b$ dependent on required characteristics, though not mentioned particularly in the preceding descriptions.

It may be repeated that a narrow portion of a doped region is responsive to the breakdown voltage of the associated pn-junction and that extending a field plate at such a narrow portion longer than at a wider portion will improve the breakdown voltage.

We claim:

1. A semiconductor device adapted to be incorporated in an integrated circuit, comprising:
    an isolated semiconductor device region of one conductivity type having one major surface in which first and second doped regions of the other conductivity type are formed by impurity doping in the form of elongated strips in parallel relationship with each other spaced apart from one another in said one major surface to form regions for a lateral semiconductor device in said isolated semiconductor device region, wherein each of said elongated strips has first and second elongated edges and first and second end portion edges which are shorter than said first and second elongated edges;
    a surface passivation film formed on the one major surface of said isolated semiconductor device region;
    first and second electrodes making low resistance contact with said first and second doped regions, respectively, through windows formed in said surface passivation film so that when predetermined voltage levels are applied to said first and second electrodes, a main current will flow laterally in said isolated semiconductor device region between said first and second doped regions; and
    a first field plate integral with said first electrode and extending to overlie said isolated semiconductor device region through said surface passivation film so as to surround a pn-junction formed by said isolated semiconductor device region and said first doped region, said first field plate having an extension width at at least one of said end portion edges of said first doped region, which extension width is larger than an extension width of said first field plate along the entire length of at least one of said first and second elongated edges of said first doped region to increase a breakdown voltage level of said lateral semiconductor device.

2. A semiconductor device according to claim 1, wherein the ends of said first doped region and said first field plate are rounded and have centers of curvature displaced from each other at least in the longitudinal direction of the elongated strip.

3. A semiconductor device according to claim 1, further comprising a third electrode making a low resistance contact with said isolated semiconductor device region through a window formed in the surface passivation film on the one major surface.

4. A semiconductor device adapted to be incorporated in an integrated circuit, comprising:
    an isolated semiconductor device region of one conductivity type having one major surface in which first and second diffusion regions of the other conductivity type are formed in the isolated semiconductor device region by impurity diffusion in the form of elongated strips in parallel relationship with each other, and in which a third diffusion region of the one conductivity type is formed in said second diffusion region in the form of an elongated strip in parallel relationship with said first diffusion region, wherein at least said first and second diffusion regions are spaced apart from one another in said one major surface to form regions for a lateral semiconductor device in said isolated semiconductor device region, wherein each of said elongated strips has first and second elongated edges and first and second end portion edges which are shorter than said first and second elongated edges;
    a surface passivation film formed on the one major surface of said semiconductor device region;
    first, second and third electrodes making ohmic contact with said first, second and third diffusion regions, respectively, wherein, when predetermined voltage levels are applied to said first, second and third electrodes, a main current will flow laterally in said isolated semiconductor device region between said first and second diffusion regions; and
    first, second and third field plates integral with said first, second and third electrodes, respectively, and extending to overlie said isolated semiconductor device region through said surface passivation film, said first field plate surrounding a pn-junction formed by said first diffusion region and said isolated semiconductor device region, said second and third field plates cooperatively surrounding a pn-junction formed by said second diffusion region and said isolated semiconductor device region, each of said field plates having an extensin width at at least one of said end portion edges of the diffuson region it surrounds larger than an extension width along the entire length of at least one of said first and second elongated edges of the diffusion region it surrounds to increase a breakdown voltage level of said lateral semiconductor device.

5. A semiconductor device according to claim 4, wherein the ends of each said diffusion region and of the associated field plate are rounded and have centers of curvature displaced from each other at least in the longitudinal direction of the elongated strip.

6. A semiconductor device according to claim 4, wherein said third diffusion region is disposed in a portion of the second diffusion region which is close to said first diffusion region.

7. A semiconductor device according to claim 1, further comprising a second field plate integral with said second electrode and extending to overlie said isolated semiconductor device region through said surface passivation film so as to surround a pn-junction formed by said isolated semiconductor device region and said second doped region, said second field plate having an extension width at at least one of said end portion edges of said second doped region, which extension width is larger than an extension width of said second field plate along the entire length of at least one of said first and second elongated edges of said second doped region to increase a breakdown voltage of said lateral semiconductor device, wherein the ends of said first doped region are rounded with a radius of curvature $r_1$, the ends of said first field plate are rounded with a radius of curvature $R_1$ having a center of curvature displaced from a center of curvature for the radius $r_1$, the ends of said second doped region are rounded with a radius of curvature $r_2$, and the ends of said second field plate are rounded with a radius of curvature $R_2$ having a center of curvature displaced from a center of curvature for the radius $r_2$, wherein said first field plate has an extension width of $W_1$ along the entire length of said at least one of said first and second elongated edges of said first doped region, wherein said second field plate has an extension width of $W_2$ along the entire length of said at least one of said first and second elongated edges of said second doped region, and wherein the relationships hold that:

$$R_1 < r_1 + W_1$$

and $$R_2 > r_2 + W_2.$$

* * * * *